(12) United States Patent
Fortin et al.

(10) Patent No.: US 7,738,617 B1
(45) Date of Patent: Jun. 15, 2010

(54) CLOCK AND DATA RECOVERY LOCKING TECHNIQUE FOR LARGE FREQUENCY OFFSETS

(75) Inventors: Guillaume Fortin, Verdun (CA); Larrie Carr, Nelson (CA); Yuiry Greshishchev, Kanata (CA); Alex Cochran, Langley (CA); Junqi (Paul) Hua, Center Valley, PA (US)

(73) Assignee: PMC-Sierra, Inc., Santa Clara, CA (US)

( * ) Notice: Subject to any disclaimer, the term of this patent is extended or adjusted under 35 U.S.C. 154(b) by 1258 days.

(21) Appl. No.: 11/237,622

(22) Filed: Sep. 28, 2005

Related U.S. Application Data

(60) Provisional application No. 60/614,198, filed on Sep. 29, 2004.

(51) Int. Cl.
*H03D 3/24* (2006.01)
*H03L 7/00* (2006.01)

(52) U.S. Cl. .................. 375/373; 375/354; 327/141

(58) Field of Classification Search .............. 375/373, 375/371, 354; 327/141; 358/409
See application file for complete search history.

(56) References Cited

U.S. PATENT DOCUMENTS

| | | | | |
|---|---|---|---|---|
| 4,368,429 | A * | 1/1983 | Jamison | 324/225 |
| 5,896,067 | A * | 4/1999 | Williams | 331/17 |
| 6,122,336 | A | 9/2000 | Anderson | |
| 6,263,034 | B1 | 7/2001 | Kanack et al. | |
| 6,748,027 | B1 * | 6/2004 | Kocaman et al. | 375/316 |
| 6,819,166 | B1 * | 11/2004 | Choi et al. | 327/551 |
| 7,346,133 | B2 * | 3/2008 | Tatem, Jr. | 375/344 |
| 2002/0175768 | A1 * | 11/2002 | Masenas et al. | 331/17 |
| 2003/0030425 | A1 * | 2/2003 | Delbo et al. | 324/76.53 |
| 2003/0118137 | A1 | 6/2003 | Skinner | |
| 2004/0071251 | A1 | 4/2004 | Sutioso et al. | |
| 2005/0200391 | A1 * | 9/2005 | Steinbach et al. | 327/156 |

OTHER PUBLICATIONS

Sidiropoulos, Stefanos, and Horowitz, Mark A.; A Semidigital Dual Delay-Locked Loop, IEEE Journal of Solid-State Circuits, vol. 32, No. 11, pp. 1683-1692, Institute of Electrical and Electronics Engineers, Nov. 1997.

Sugawara, Mitsutoshi, et. al., "1.5 Gbps, 5150 ppm Spread Spectrum SerDes PHY with a 0.3 mW, 1.5Gbps Level Detector for Serial ATA," 2002 Symposium on VLSI Circuits, Digest of Technical Papers, Institute of Electrical and Electronics Engineers 2002, pp. 60-63.

\* cited by examiner

*Primary Examiner*—David C Payne
*Assistant Examiner*—Brian J Stevens
(74) *Attorney, Agent, or Firm*—Knobbe Martens Olson & Bear LLP

(57) ABSTRACT

Techniques and apparatus for a clock and data recovery circuit to lock to data having frequency offsets relative to a local clock reference are disclosed. One embodiment includes a multi-step frequency tracking system in which each step is used to track a sub-range of frequency deviation from local clock reference. The frequency tracking sub-range of each step is selected so that the clock and data recovery system is relatively assured of achieving lock when the frequency of the incoming data lies within or is relatively near the frequency tracking sub-range of the selected step. Embodiments may use control signals to select the sub-ranges, and hence guide the frequency tracking portion of the clock and data recovery circuit to operate in a frequency tracking range that is optimized for achieving and maintaining lock.

9 Claims, 19 Drawing Sheets

SATA standard recommended triangular spread spectrum clocking

Data may or may not be modulated by spead spectrum clocking

FIG. 8  *PRIOR ART*

CLOCK AND DATA RECOVERY LOCKING TECHNIQUE FOR LARGE FREQUENCY OFFSETS

CROSS-REFERENCE TO RELATED APPLICATIONS

This application claims the benefit under 35 U.S.C. §119 (e) of U.S. Provisional Application No. 60/614,198, filed Sep. 29, 2004, the entirety of which is hereby incorporated by reference.

BACKGROUND OF THE INVENTION

1. Field of the Invention

The invention generally relates to circuits, and particularly to clock and data recovery circuits.

2. Description of the Related Art

A host and a device typically transmit and receive data to and from each other. For example, in a personal computer or in an enterprise storage system, a disk drive controller (host) is typically coupled to a disk drive (device) using a standardized interface. For example, the host and the device can be operatively connected by a Serial Advanced Technology Attachment (SATA) interface, by a Serial Attached SCSI (SAS) interface, and the like.

The SAS interface standard imposes relatively strict system level requirements on both the host and the device. For example, the system reference clock frequency range is limited to ±100 parts per million (ppm). FIG. 1 illustrates a host and device connection by a SAS interface. Since the total frequency offset between the host and the device is only ±200 ppm, a single loop clock and data recovery system can be used. FIG. 2 illustrates a conventional single loop clock and data recovery system.

To assist with the compliance of electromagnetic emissions standards, the SATA interface standard permits the data to be modulated using a spread spectrum clocking (SSC) scheme. FIG. 3 illustrates a SSC modulation scheme in which a triangular waveform is used to vary the frequency of the data between 0 and −5000 ppm from a nominal frequency. The frequency range of the waveform used to SSC modulate the data is typically about 30 kHz to about 33 kHz. In addition to the spread spectrum modulation, a SATA system should be able to tolerate another ±350 ppm frequency offset from each of the host side and the device side as illustrated in FIG. 4.

The single loop clock and data recovery circuit illustrated in FIG. 2 is typically not able to recover spread spectrum clocking (SSC) modulated information with relatively good jitter tolerance. FIG. 5 illustrates phase tracking for a single loop clock and data recovery circuit.

The maximum phase error $PE_{freq(max)}$ introduced by a frequency offset can be calculated using Equation 1.

$$PE_{freq(max)} = F_{data} * PPM_{(max)} * Time(UI) \qquad \text{Equation 1}$$

In Equation 1, $F_{data}$ represents the rate of the clock embedded in the data, and $PPM_{(max)}$ represents the maximum frequency offset. "UI" indicates the unit interval over which the phase error is calculated.

The clock and data recovery tracking phase $TP_{CDRU}$ can be calculated using Equation 2.

$$TP_{CDRU} = F_{ud} * \Delta p * Time(UI) \qquad \text{Equation 2}$$

In Equation 2, $F_{ud}$ represents the phase update rate, and $\Delta p$ represents the phase update step.

Equation 3 expresses a calculation for a phase update rate $F_{ud}$ to compensate for the phase error induced by a frequency offset.

$$F_{ud} = \frac{F_{data} \times PPM}{\Delta p} \qquad \text{Equation 3}$$

Using a first-generation SATA interface (1.5 Gbps data rate) as an illustrative example and selecting $\Delta p$ to be 1/32 UI, the phase update rate $F_{ud}$ should be at least 240 MHz as illustrated in the following equations. As the conventional phase tracking loop illustrated in FIG. 2 is predominantly occupied tracking the phase error induced by this relatively large frequency offset, high frequency phase jitter performance suffers. This degrades the overall system jitter tolerance performance.

$$F_{data} = 1.5 \text{GHz} \qquad \text{Equation 4}$$

$$PPM = 5000 \text{ppm} \qquad \text{Equation 5}$$

$$\Delta p = 1/32 \text{UI} \qquad \text{Equation 6}$$

$$F_{ud} = \frac{F_{data} \times PPM}{\Delta p} = 240 \text{ MHz} \qquad \text{Equation 7}$$

To recover spread spectrum modulated data and/or data with a relatively large static frequency offset with respect to a local reference clock, a more complex clock and data recovery circuit is typically used than the circuit illustrated in FIG. 2.

FIG. 6 illustrates a conventional dual loop clock and data recovery circuit with a single accumulator range. The dual loop clock and data recovery circuit has an additional loop for frequency tracking over the circuit illustrated in FIG. 2. The frequency tracking loop is used to track frequency offset induced phase errors, which permits the phase tracking loop to track high frequency phase noise relatively efficiently. The clock and data recovery system depicted in FIG. 6 can be sensitive to initial conditions, which can prevent the clock recover system from achieving phase lock with the received data. When the initial conditions of the system are such that an offset from the frequency tracking path exceeds a correctable range of the phase tracking path, the clock and data recovery system can have difficulty achieving phase lock.

FIG. 7 illustrates a conventional triple loop clock and data recovery circuit having a frequency tracking loop, a phase tracking loop, and an initial frequency setting loop. The analog implementation of the triple loop clock recovery system of FIG. 7 typically consumes relatively large amounts of power, which makes it undesirable for use where power budgets are relatively small.

FIG. 8 illustrates a conventional dual loop clock and data recovery system with a single accumulator range with accumulator limits of A and D shown in FIG. 8. The dual-loop architecture includes two tracking paths. A phase tracking path is used to track phase differences between the local clock reference signal and the received data signal. A frequency tracking path including an accumulator 802 tracks frequency offsets between the received data signal and the local clock reference. This permits the clock and data recovery system to track relatively wide frequency offsets without degrading the jitter tolerance of the system.

A value representing the frequency offset is stored in a register D of the accumulator 802. When the accumulator value tracks the frequency offset between the received data signal and the local clock reference signal, the system can be referred to as "locked". Otherwise, if the accumulator value drifts to a value that is out of range with respect to the frequency offset of the incoming data signal, the system can be referred to as "unlocked."

The clock information is embedded in the received data. For a multi-purpose/multi-application device, the frequency variation of the incoming clock can initially be unknown to the receiver or system. The frequency variation can include fixed offsets, frequency ranges, and the like. For example, the device may have to be compatible with different protocols such as Serial Advance Technology Attachment (SATA), Serial Attached SCSI (SAS), and the like. In the SATA standard, the received data may optionally be modulated by a low frequency profile such as the triangular waveform illustrated in FIG. 3. In this case, the frequency of the embedded clock can be close to or vary by as much as 5700 ppm with respect to the local clock reference signal.

For a clock and data recovery system to recover an embedded clock signal from the received data signal properly, the accumulator range of the frequency tracking path should be at least large enough to support the largest frequency offset possible for all protocols specified for the clock and data recovery system. For example, if the clock and data recovery circuit is to be used in devices that support both the SATA and SAS protocols, the accumulator should be able to cover a 5000 ppm spread spectrum down spreading plus ±350 ppm transmitter/receiver reference clock offsets as specified by SATA standard. Such a device typically uses a clock and data recovery system specified to track data with offsets ranging from +700 ppm to −5700 ppm.

When the frequency of the received data signal is spread spectrum modulated, such as permissible by the SATA protocol, the frequency of the incoming data signal (the received data signal) should periodically fall within the locking range of the system regardless of the initial value of the accumulator, and the system should eventually attain phase lock.

However, if the frequency of the received data signal is not modulated and the value stored in the accumulator is such that a resulting frequency offset exceeds a correctable range of the phase tracking path of the clock and data recovery system, the system can have difficulty achieving lock. For example, the clock and data recovery system can be specified to cover a frequency offset of +700 ppm to −5700 ppm to be compliant with the SATA standard. The limits of the accumulator range can be represented by A and D, where A represents +700 ppm of frequency offset, and D represents −5700 ppm of frequency offset. Assuming the accumulator initial value has drifted to limit D, the recovered clock frequency forced by the frequency tracking path can be calculated by Equation 8.

$$F_{rclk}(D) = (1-5700\text{ppm})F_{nom} \quad \text{Equation 8}$$

In Equation 8, $F_{nom}$ represents the frequency of the receiver system clock signal. If the received data signal is not spread-spectrum modulated, the embedded clock frequency is approximately $F_{nom}$. With the accumulator at limit D, the clock and data recovery system is stressed by approximately a 5700 ppm frequency offset as expressed by Equation 8.

FIG. 9 illustrates the clock and data phase error accumulation due to frequency offset in which PPM represents a frequency offset (expressed in ppm) between the frequency $F_{rclk}$ of the recovered clock signal and the frequency $F_{nom}$ of the local clock reference.

In a real-life system, a phase tracking loop typically includes a contribution from a gain stage of 1/N, where N is the number of clock cycles per update of the clock phase by Δp unit intervals (UI). In the illustrated example of FIG. 9, where the rising edge of the clock starts in the middle of the data period at time T1, the phase error increases by about PPM UI per clock cycle, e.g., PPM*N*T. After N clock cycles, the clock and data phase error is N*PPM UI. If the phase update step Δp is at least as large as the accumulated phase error N*PPM as shown in Equation 9 (both expressed in unit intervals), the clock and data recovery system should be able to maintain phase lock.

$$\Delta p \geq N*PPM \quad \text{Equation 9}$$

For example, in a system where N is 16, and the phase update step Δp is ⅟₃₂ UI, the maximum offset for the frequency offset PPM for which the phase tracking loop is expected to be able to achieve lock is calculated in Equation 10.

$$PPM \leq \Delta p/N = 1953\text{ppm} \quad \text{Equation 10}$$

For example, for a dual-loop clock and data recovery system characterized by the relationship expressed in Equation 10, achieving lock when a frequency offset of more than about 2000 ppm exists can be problematic.

SUMMARY

The present invention comprises an apparatus for recovering a clock signal, the apparatus including: a phase detector configured to receive an input data signal and to receive a recovered clock signal, the phase detector further configured to generate a signal with an indication of a phase difference between the input data signal and the recovered clock signal; and a feedback circuit operatively coupled to the phase detector, the feedback circuit configured to receive the generated signal from the phase detector and to receive a reference signal, the feedback circuit configured to generate the recovered clock signal, the feedback circuit takes into consideration whether the recovered clock signal is phase locked to the input data signal in selecting a frequency range.

The invention also includes an apparatus for recovering a clock signal, the apparatus including: means for receiving an input data signal; means for generating a recovered clock signal based at least partially on a reference signal and an adjustment; means for generating the adjustment for the recovered clock signal based at least partly on a comparison between the input data signal and the recovered clock signal; and means for limiting a frequency range for the adjustment to a first frequency range when the input data signal and the recovered clock signal are not locked and for limiting a frequency range for the adjustment to a second frequency range larger than the first frequency range when the input data signal and the recovered clock signal are locked.

The invention further includes a method for recovering a clock signal, the method including: receiving an input data signal; receiving a reference signal; generating an adjustment for a recovered clock signal based at least partly on a comparison between the input data signal and a recovered clock signal; limiting a frequency range for the adjustment to a first frequency range when the input data signal and the recovered clock signal are not locked; limiting a frequency range for the adjustment to a second frequency range other than the first frequency range when the input data signal and the recovered clock signal are locked; and generating the recovered clock signal based at least partly on the reference signal and the adjustment.

DETAILED DESCRIPTION OF SPECIFIC EMBODIMENTS

Embodiments of the invention can advantageously be used in a variety of applications. For example, it can be desirable for a system to be able to achieve lock to a variety of different interfaces, but these interfaces can have varying frequency ranges that make it difficult for a system to be able to achieve lock to data from the interface without knowing ahead of time, which frequency range will be applicable. The problem can be more acute when the frequency range should be broad to cover a potentially wide frequency range, such as encountered with spread-spectrum modulated frequencies, and yet should cover a relatively narrow range within the wide frequency range, such as with a Serial Attached SCSI (SAS) interface. The systems and methods disclosed herein permit a clock and data recovery system to be able to achieve lock to a wide variety of frequency ranges, which thereby permits a system using the clock and data recovery system to be used in a wide variety of applications or with a decreased amount of user intervention, such as the setting of switches to preselect a frequency range.

Accumulator Sub-Ranges

Figure 1:
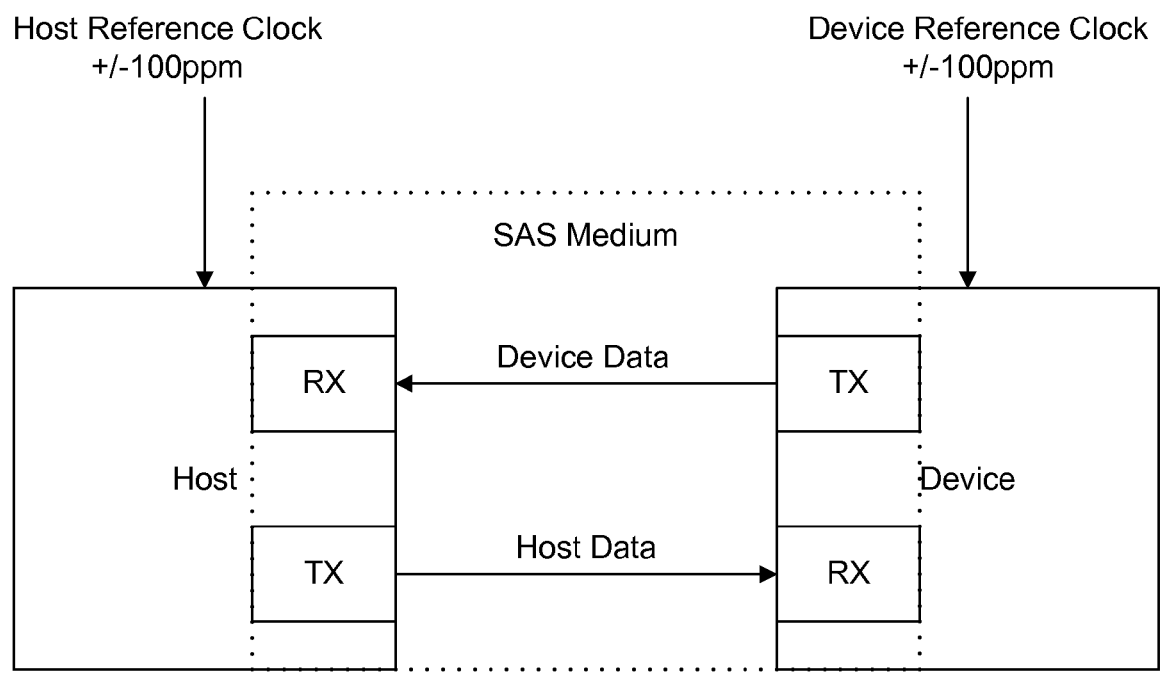
FIG. 1 illustrates a host and device connection by a Serial Attached SCSI (SAS) interface.
Figure 2:
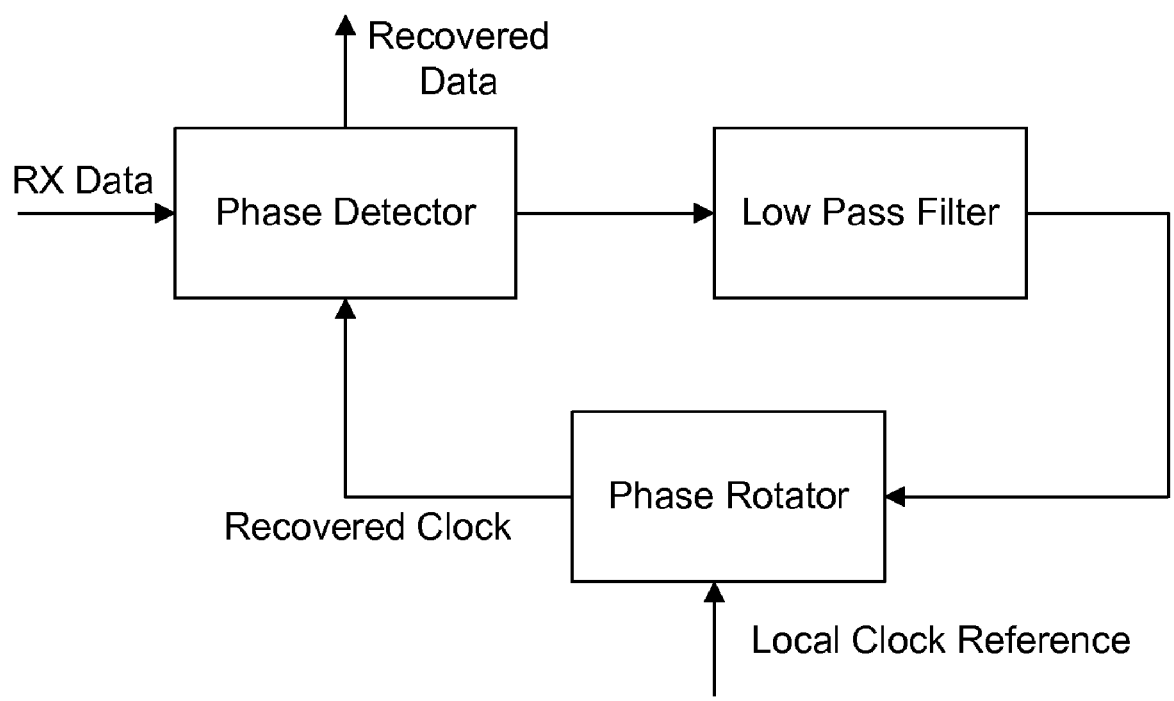
FIG. 2 illustrates a conventional single loop clock and data recovery system.
Figure 3:
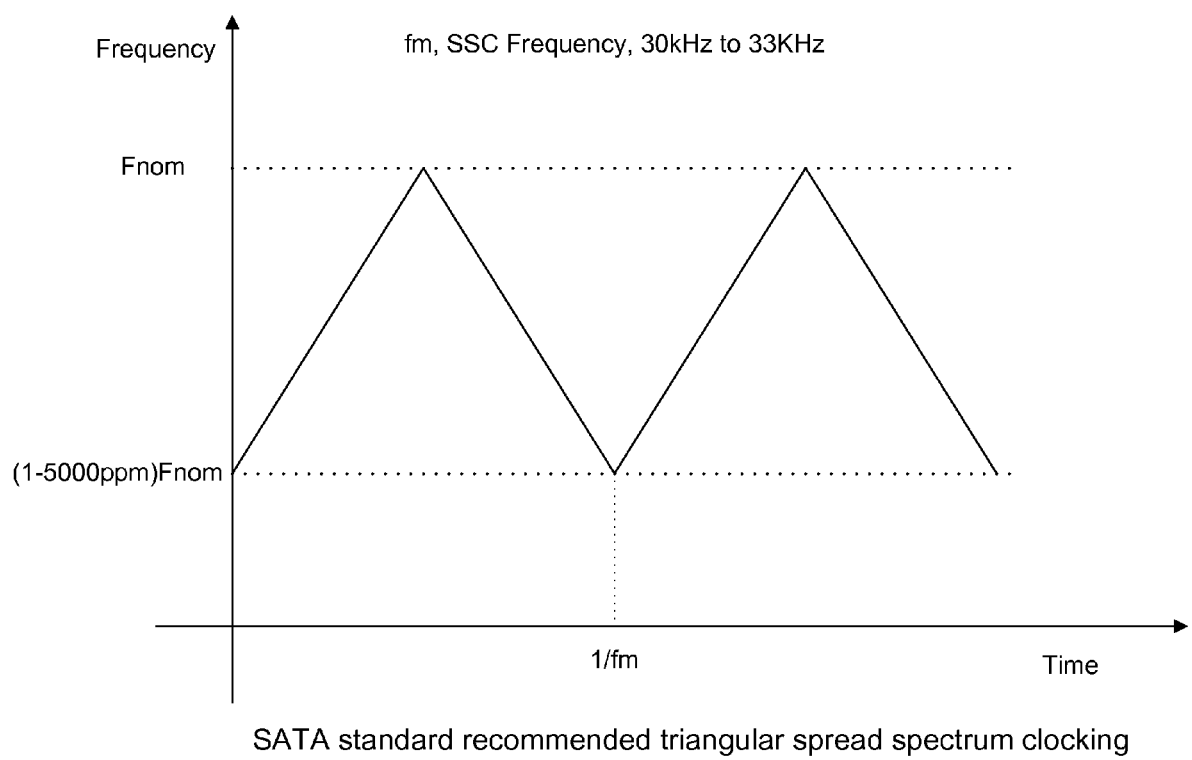
FIG. 3 illustrates an example of a spread spectrum clocking (SSC) modulation scheme.
Figure 4:
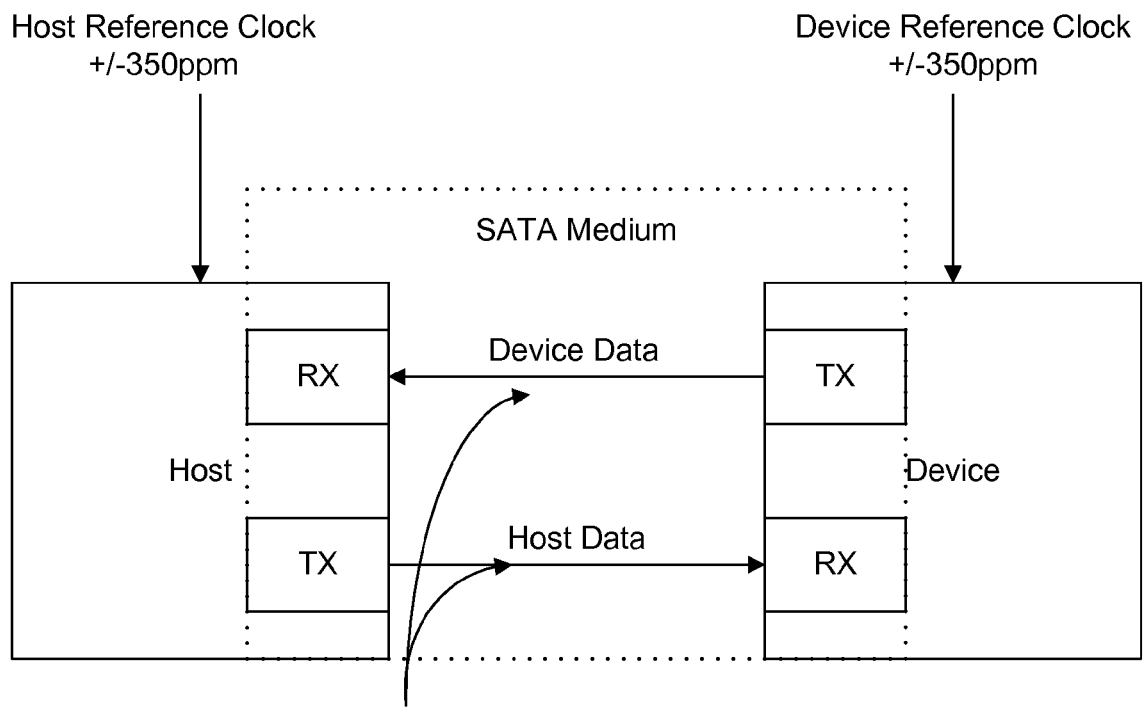
FIG. 4 illustrates a host and device connection by a Serial ATA (SATA) interface.
Figure 5:
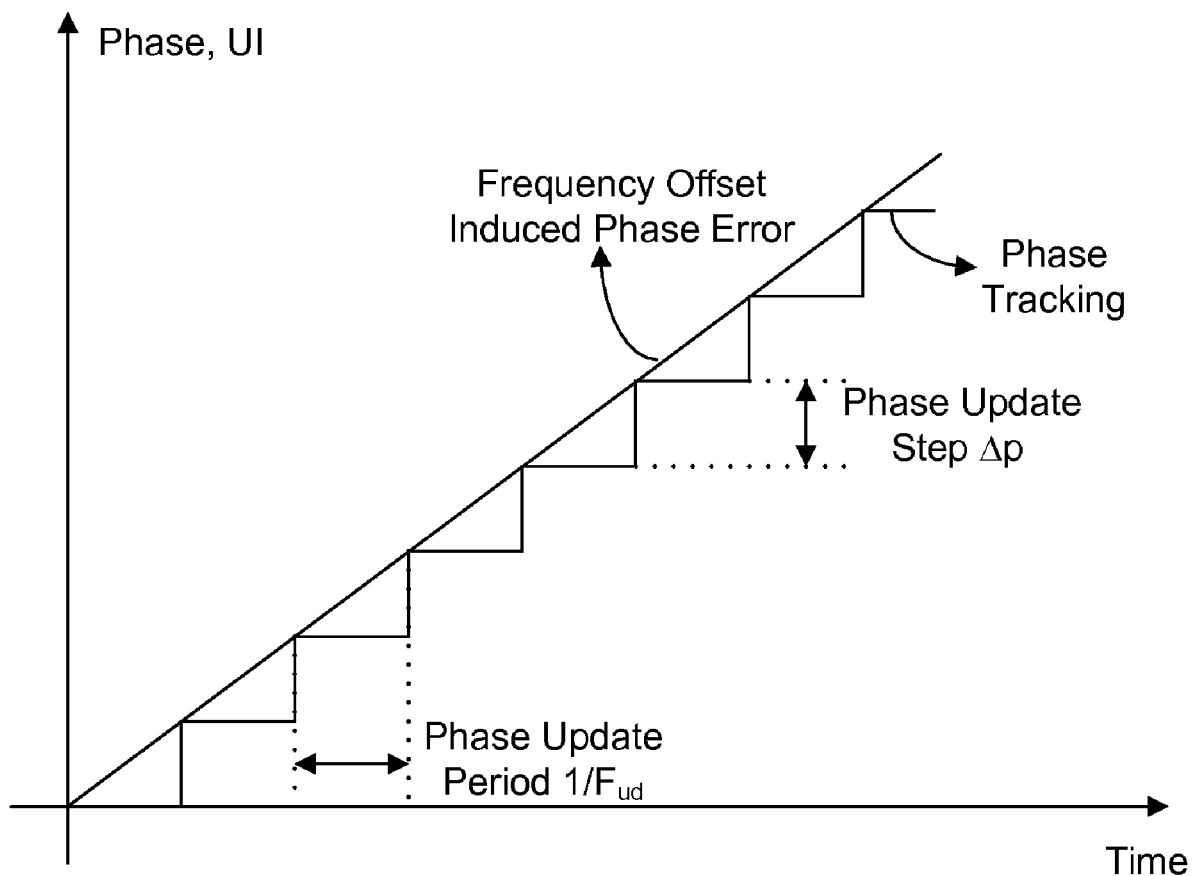
FIG. 5 illustrates phase tracking for a single loop clock and data recovery circuit.
Figure 6:
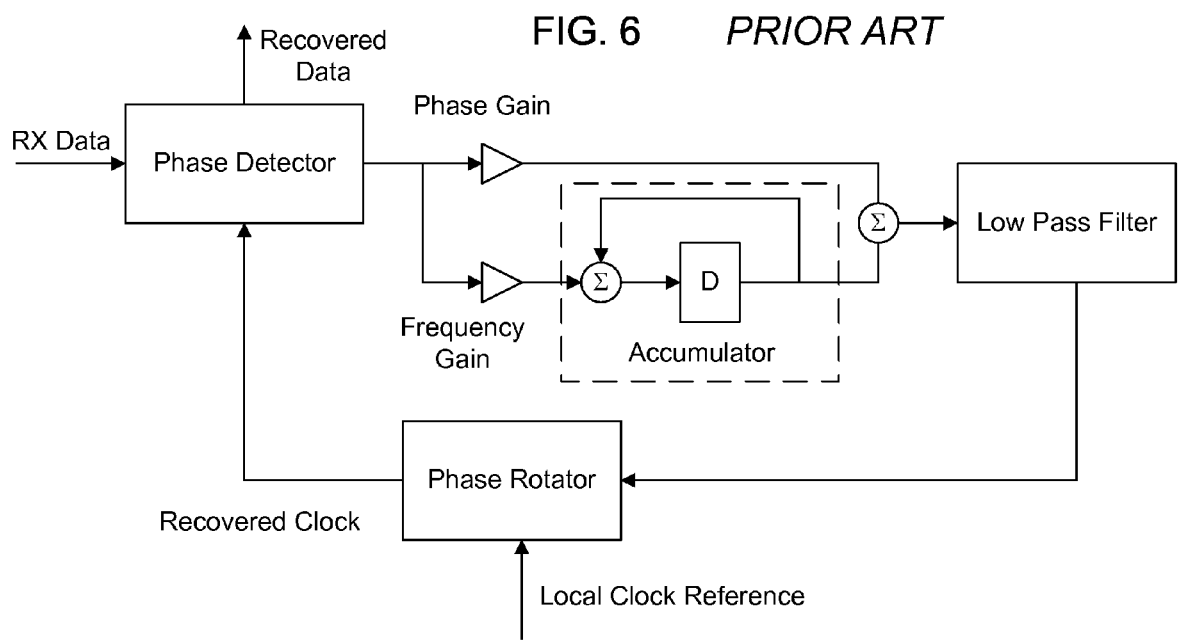
FIG. 6 illustrates a conventional dual loop clock and data recovery circuit with a single accumulator range.
Figure 7:
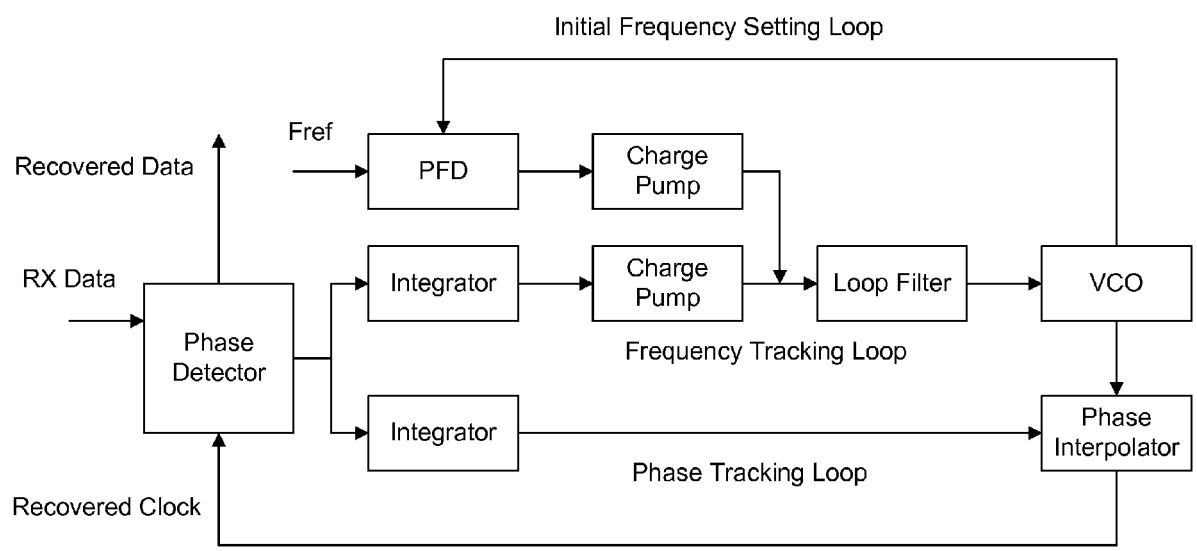
FIG. 7 illustrates a conventional triple loop clock and data recovery circuit.
Figure 8:
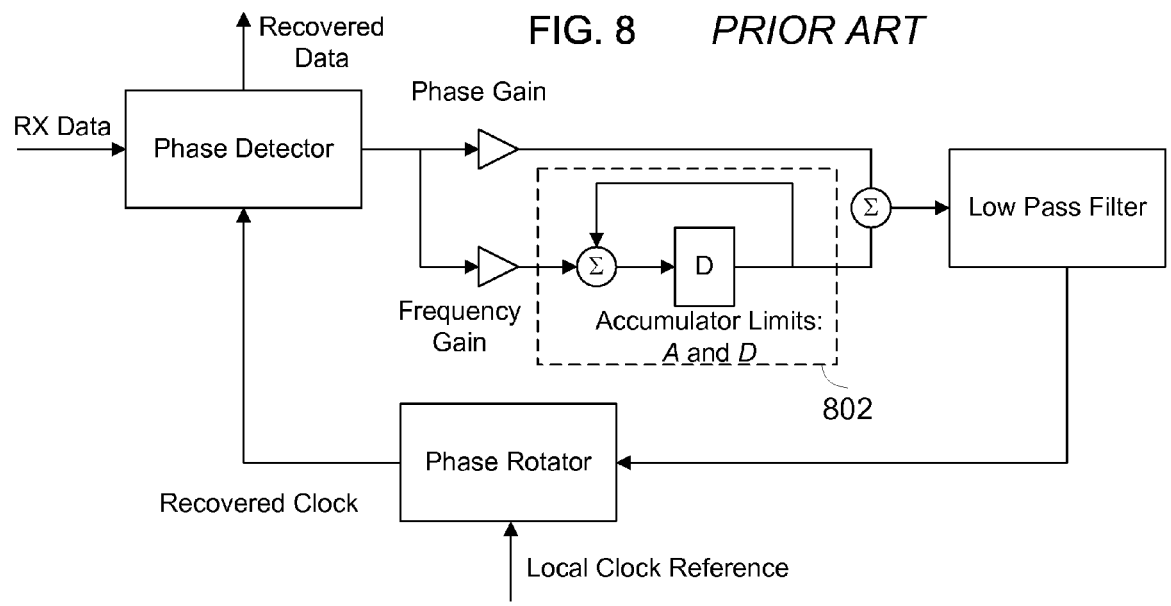
FIG. 8 illustrates a conventional dual loop clock and data recovery system with a single accumulator range (accumulator limits shown as A and D).
Figure 9:
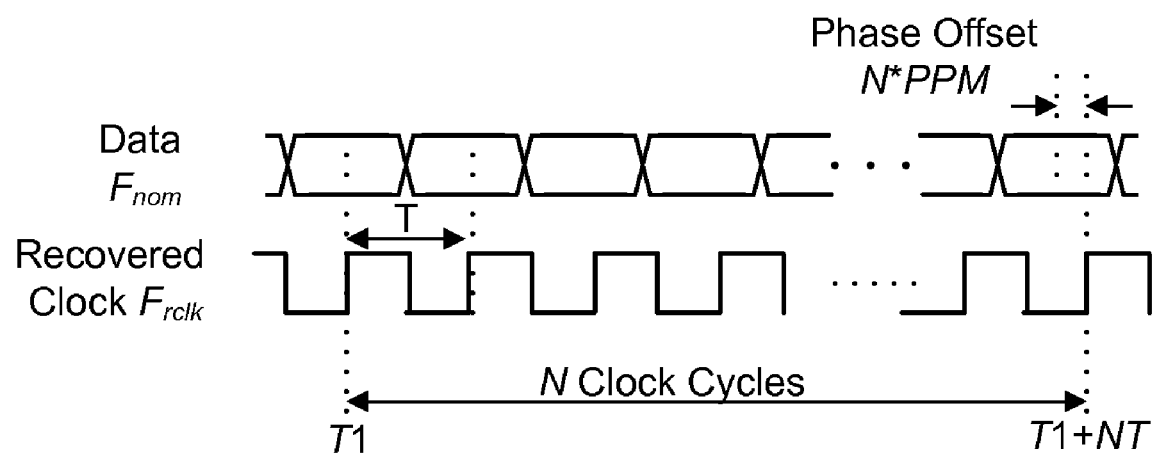
FIG. 9 is a timing diagram illustrating an example of clock and data phase error accumulation.

As described earlier in connection with FIG. 8, the accumulator 802 of a dual loop clock and data recovery system is typically configured to support a relatively wide range of received data frequencies $F_{rclk}$. During real-life operation, the value stored in the accumulator 802 can drift to any value within the accumulator's range (between limits A and D in FIG. 8) due to floating inputs, noise, hot plugging, and the like. When the frequency offset between the frequency $F_{nom}$ of the received data and the frequency $F_{rclk}$ of the recovered clock exceeds the clock and data recovery system's locking range, the clock and data recovery system is not assured of achieving phase lock.

Figure 10:
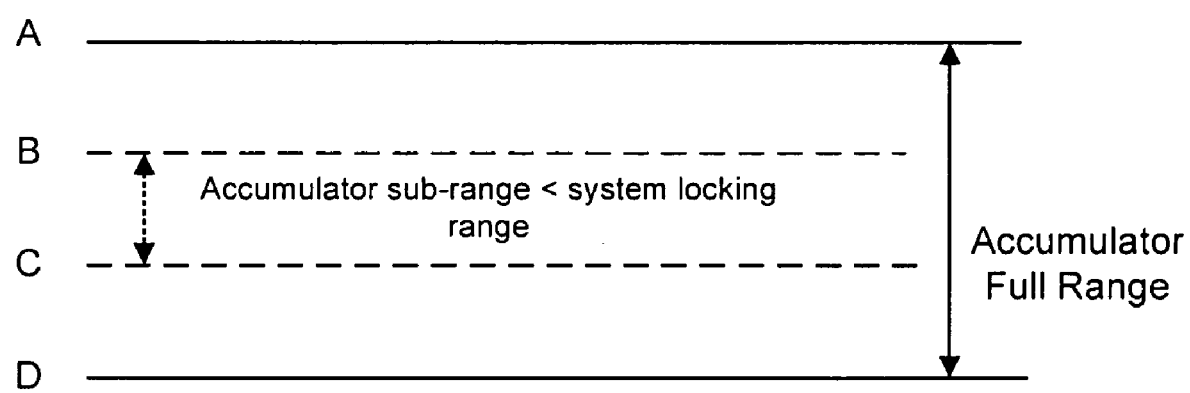
FIG. 10 illustrates an example of accumulator sub-ranges.
Figure 11:
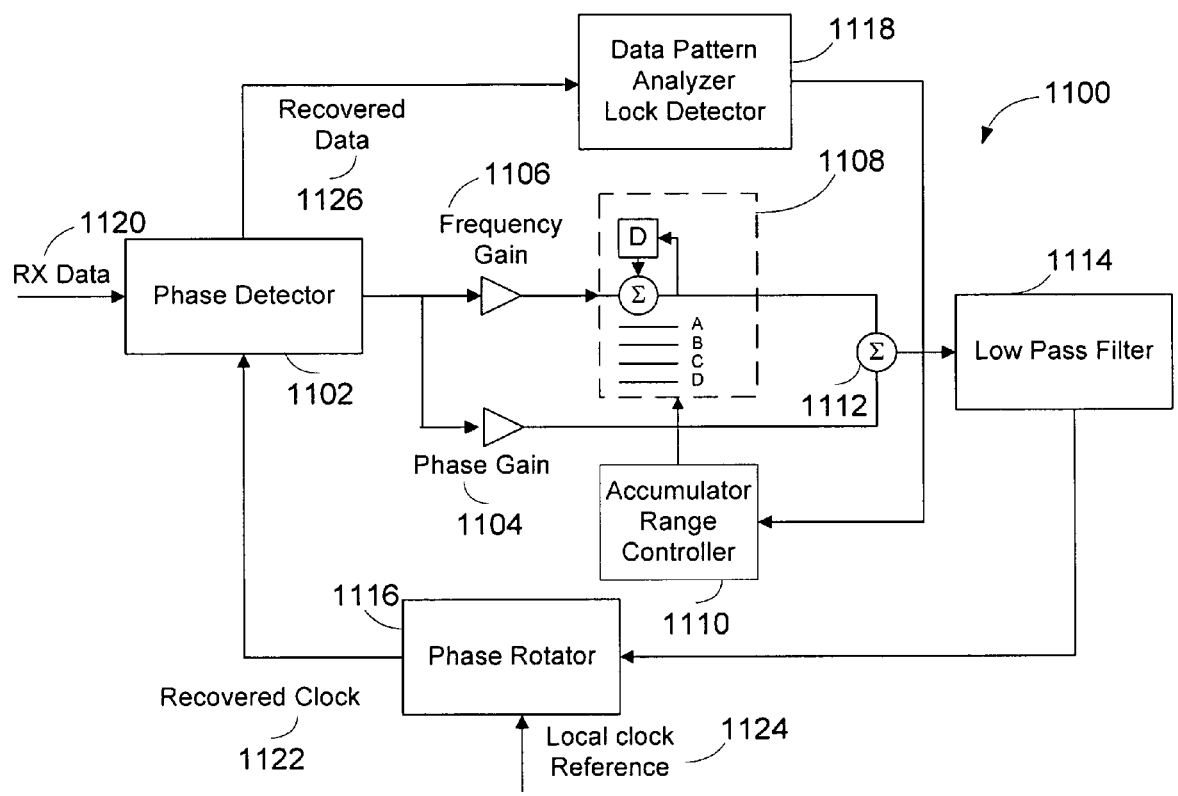
FIG. 11 illustrates an embodiment according to the invention of a clock and data recovery system with a controllable accumulator range.

One embodiment according to the invention narrows a total or full accumulator range, e.g., with limits A and D, into one or more sub-ranges, each smaller than the total accumulator range as illustrated by the example with 3 sub-ranges in FIGS. 10 and 11. As will be described in greater detail later in connection with FIGS. 11 and 12, one embodiment of the clock and data recovery system automatically limits the frequency range of an accumulator 1108 to an appropriate sub-range, e.g., with limits A and B, so that even with the maximum specified offset, e.g., worst case offset, between the frequency $F_{nom}$ of the received data and the frequency $F_{rclk}$ of the recovered clock as partially determined by the selected sub-range of the accumulator 1108, the frequency $F_{nom}$ of the received data at least momentarily passes through the locking range of the clock and data recovery system such that phase locking can be achieved. After lock has initially been attained, the range of the accumulator 1108 can be "released" to the full range so that the clock and data recovery system operates over its full intended frequency tracking range. In another embodiment, the accumulator 1108 can be restricted to operate within a frequency tracking sub-range after the clock and data recovery system is locked. The choice of accumulator operating range depends upon the desired application of the clock recovery system. In another embodiment, which will be described in greater detail later in connection with FIG. 18, the offset range is limited by adjusting the gain of the frequency tracking path instead of reducing the accumulator range directly. After an initial locking is achieved, the offset range is released by increasing the gain of the frequency tracking path.

Pre-Locking Accumulator Sub-Range

Various embodiments will now be described. It will be readily understood by the skilled practitioner that the benefits of particular embodiments can vary depending on the intended application.

FIG. 11 illustrates one embodiment of a clock and data recovery system 1100 with a controllable accumulator range. The illustrated embodiment of the clock and data recovery system 1100 is implemented using digital hardware. For example, customized application specific integrated circuits, field programmable gate arrays, programmable logic devices and the like can be used.

The clock and data recovery system 1100 includes a phase detector 1102, a phase tracking path including a phase gain stage 1104, a frequency tracking path including a frequency gain stage 1106, an accumulator 1108, and an accumulator range controller 1110, a summing circuit 1112, a low pass filter 1114, a phase rotator circuit 1116, and a data pattern analyzer/lock detector 1118. The phase detector 1102 receives a received data signal RX Data 1120 and a recovered clock signal 1122 as inputs and generates a comparison of phase. In one embodiment, the output of the phase detector 1102 is a +1 or a −1 based on the phase comparison.

The output of the phase detector 1102 is provided as an input to the phase gain stage 1104 and to the frequency gain stage 1106. The phase gain stage 1104 and the frequency gain stage 1106 can affect the loop gain of the phase tracking loop and the frequency tracking loop, respectively, by providing an update to the phase rotator 1116 after, for example, N clock cycles. It will be understood that the phase gain stage 1104 and the frequency gain stage 1106 can have different gains.

The output of the frequency gain stage 1106 is provided as an input to the accumulator 1108. The accumulator 1108 can combine the output from the frequency gain stage 1106 with a previous value stored in a register D of the accumulator 1108. Initially, the register D can be cleared to start at a value of zero, but other values can also be used as an initial condition. In the illustrated embodiment, the accumulator range controller 1110 in communication with the accumulator 1108 can adjust the limits of the range for values stored by the accumulator 1108, thereby controlling a frequency offset range that can be used to lock to the received data signal RX data 1120. This can limit the frequency of a recovered clock signal 1122, so that the difference in frequency between the received data signal RX data 1120 and the recovered clock signal 1122 can be within the locking range of the phase tracking loop.

The outputs of the phase gain circuit 1104 and the accumulator 1108 are combined by a summing circuit 1112, and the sum is provided as an input to the low pass filter 1114. The output of the low pass-filter 1114 and a local clock reference signal 1124 are provided as inputs to the phase rotator 1116, which generates the recovered clock signal 1122 from these signals.

When the recovered clock signal 1122 and the received data signal RX Data 1120 are in phase lock, a recovered data signal 1126 can be generated using the recovered clock signal 1122. For example, a slicer using the timing provided by the recovered clock signal 1122 can determine the embedded symbols of the received data signal RX Data 1120 for the recovered data signal 1126. In the drawing of FIG. 11, the slicer is part of the block for the phase detector 1102.

A data pattern analyzer/lock detector 1118 can monitor the recovered data signal 1126 to determine whether phase lock has been achieved. For example, the data pattern analyzer/lock detector 1118 can determine that lock has been achieved when a predetermined pattern is detected in the recovered data signal 1126 of the received signal data RX Data 1120.

The accumulator 1108 has a total or full range of limit A to limit D, which, for example, can be selected to cover the maximum frequency offset range of the intended application. For the purposes of illustration, the total range AD is divided into three sub-ranges, AB, BC, and CD respectively. The applicable range for a sub-range can vary depending on the intended application. In the illustrated examples, sub-ranges that are appropriate for SATA and SAS interfaces will be described; however, it will be understood that other sub-ranges will also be applicable particularly when applied to other interface standards. In addition, while generally described in the context of SATA and SAS interface standards, it will be appreciated that the principles and advantages described herein will be applicable to other interface standards and to any clock and/or data recovery system that locks to data and is intended to cover a relatively wide range of frequency offsets.

When the clock and data recovery system 1100 is not locked, the accumulator range controller 1110 sets the accumulator frequency range to one of the sub-ranges. The particular sub-range selection can be application dependent, but it will be understood that the accumulator sub-range should be selected so that the input data will be within the frequency tracking range of the clock and data recovery system at least momentarily. After the data pattern analyzer/lock detector 1118 detects a data pattern and/or other indication of lock, the frequency range of the accumulator 1108 is changed by the accumulator range control 1110 so that the accumulator 1108 can operate over its full range.

As a design example, the clock and data recovery system 1100 is specified to be compliant to both the SATA and the SAS interface standards. The SATA standard specifies that the clock and data recovery system 1100 be able to track a range of frequencies from +700 ppm to −5700 ppm (±350 ppm for transmit/receive reference clocks, and −5000 ppm for spread-spectrum down spreading). However, the SAS standard specifies that the clock and data recovery system 1100 be able to recover data having a ±200 ppm offset range (±100 ppm for transmit/receive reference clocks). The illustrated AB sub-range is selected as an initial frequency range, and in this example covers a ±700 ppm frequency offset. Advantageously, the selected AB sub-range meets all the following illustrative design specifications listed for this example. For example, the AB sub-range should cover SAS frequency offsets; the AB sub-range should cover, or partially cover, the SATA frequency offsets, and assuming that the lock range of the clock and data recover system 1100 is the same or better than the lock range expressed in Equation 10, the total offset (1400 ppm) of the AB sub-range should be less than the clock and data recovery system 1100 lock range.

Figure 12:
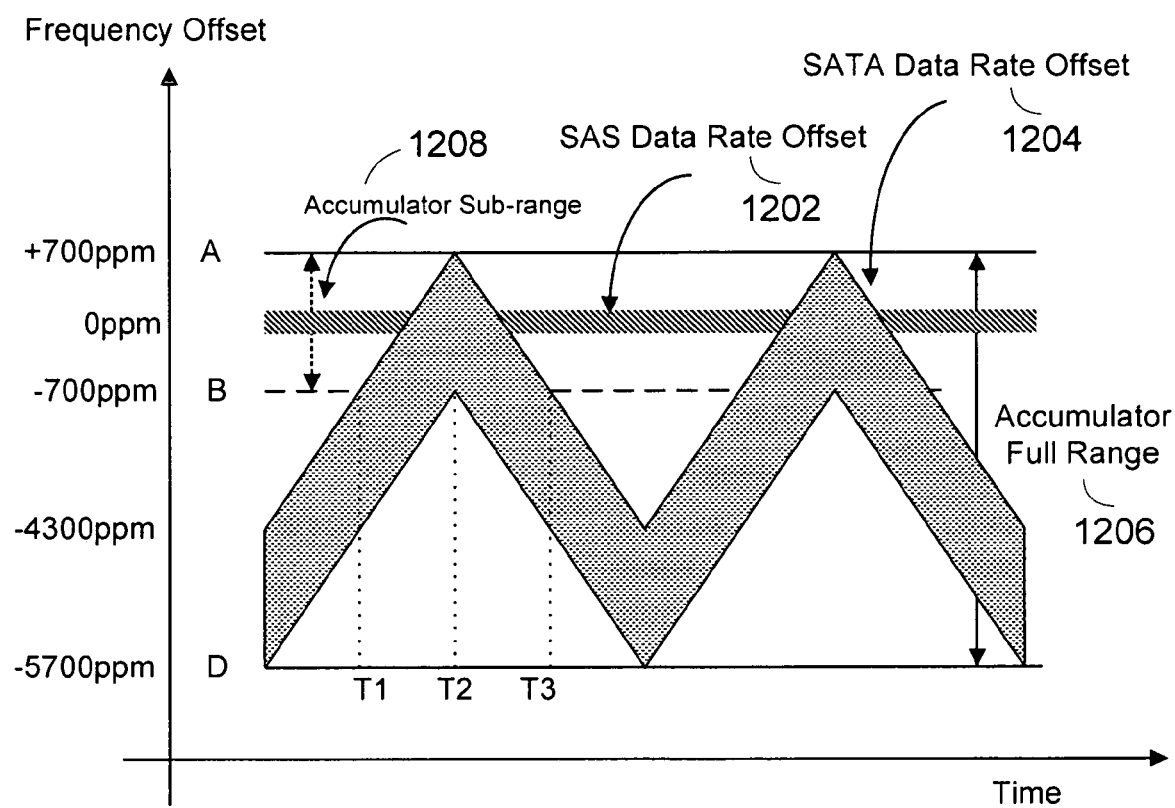
FIG. 12 illustrates a plot over time of permissible frequency offsets according to a Serial Attached SCSI (SAS) interface standard and to a Serial Advanced Technology Attachment (SATA) interface standard and also illustrates a full range for an accumulator and a sub-range.

FIG. 12 illustrates a plot over time (not to scale) of permissible frequency offsets according to a Serial Attached SCSI (SAS) interface standard 1202 and to a Serial Advanced Technology Attachment (SATA) interface standard 1204 and also illustrates a full range 1206 for the accumulator 1108 and for a sub-range 1208. Time is indicated along a horizontal axis. A frequency offset is indicated along a vertical axis.

When used in an SAS interface, since the SAS data rate offset 1202 lies within the AB sub-range 1208 and the lock range expressed in Equation 10 covers the AB sub-range 1208 regardless of where within the AB sub-range 1208 the accumulator 1108 is set, the clock and data recovery system 1100 should quickly lock to incoming SAS data. When used in a spread-spectrum modulated SATA interface, the received data frequency offset 1204 is close to the AB sub-range window after time T1. Depending on where in the AB sub-range the accumulator 1108 is operating, and where in the permissible SATA standard the up-to ±700 ppm frequency offset is, the clock and data recovery system 1100 can already be locked by time T1. It will be understood that this depends on the locking range of the phase tracking loop. After time T2, the clock and data recovery system should be locked to the SATA spread spectrum modulated data. The lock detector and/or pattern analyzer 1118 detects the locked condition and releases the sub-range before or around time T3, which is the time data rate offset passes over the sub-range window. It will be understood that even beyond T3, it can be possible to remain locked because of the phase tracking range, which is not shown in FIG. 12. Note that the times T1, T2 and T3 are implementation dependent.

This embodiment is one of many possible solutions and is applicable where possible received data has a common data rate offset range such as ±700 ppm shown in the above example. As will be readily determined by the skilled practitioner, a usable sub-range will vary considerably depending on the range of the phase tracking loop.

Accumulator Reset Process

Figure 13:
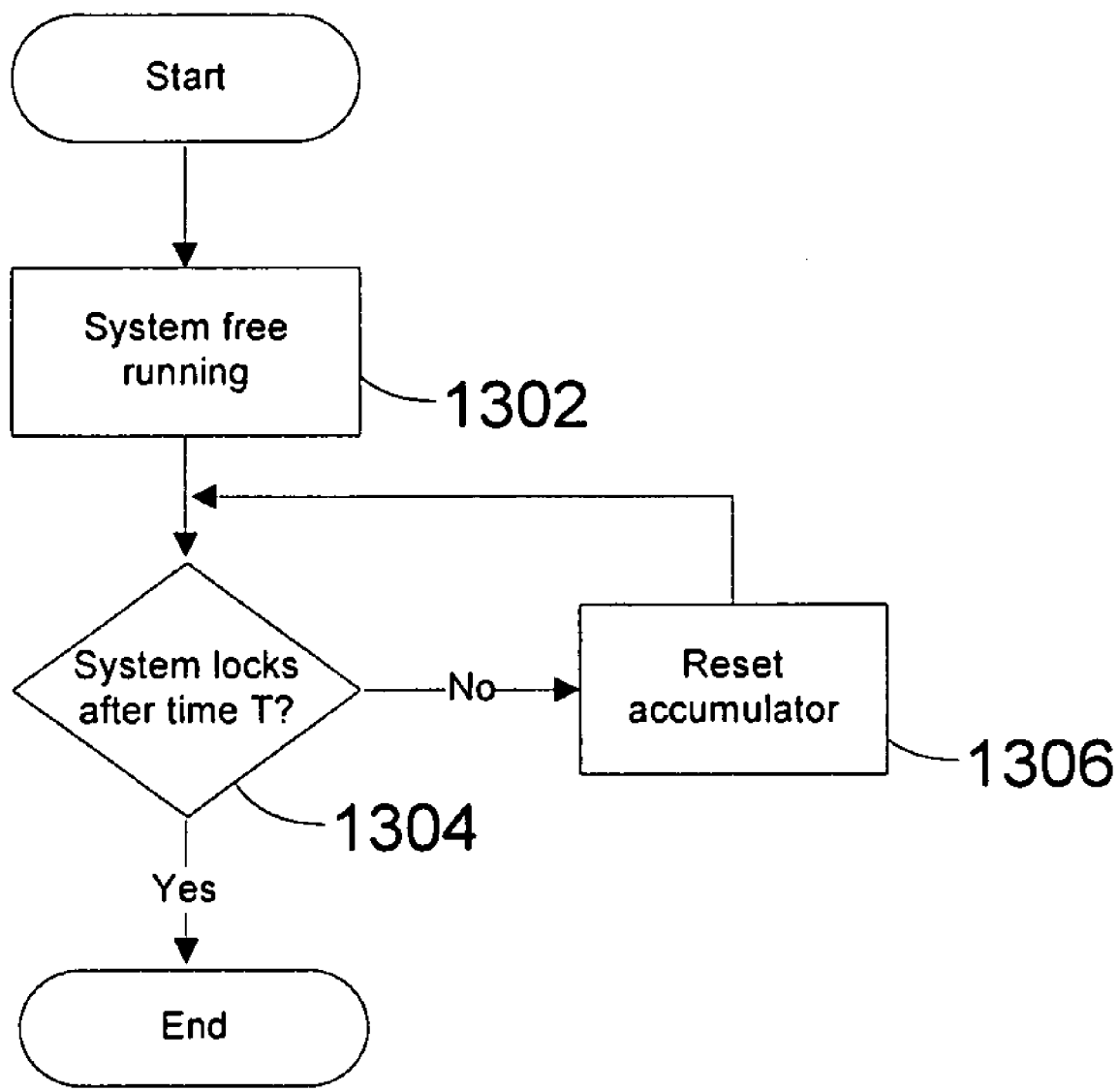
FIG. 13 is a flowchart illustrating an accumulator resetting technique.

The clock and data recovery multi-step locking technique described earlier in connection with FIGS. 11 and 12 adjusts at least one of the limits of the accumulator 1108, which dynamically changes the frequency tracking range of the clock and data recovery system 1100. FIG. 13 illustrates another embodiment of the invention in which an accumulator is reset to a predetermined value when a corresponding clock and data recovery system does not achieve lock within a specified timing limit. The process illustrated in connection with FIG. 13 can be used with or can be used independently of the multi-step locking technique described earlier in connection with FIGS. 11 and 12. For example, the accumulator that is reset can correspond to accumulator 802 of FIG. 8 or to the accumulator 1108 of FIG. 11.

The illustrated process can be modified in a variety of ways. For example, in another embodiment, various portions of the illustrated process can be combined, can be rearranged in an alternate sequence, can be removed, and the like. The process starts at a state 1302, in which the clock and data recovery system is free-running and not locked to a received signal, which may or may not be present. The process advances to a decision block 1304, where the process determines whether a predetermined time T has elapsed for which the system has not locked to a received signal. For example, the predetermined time T can be about 30 microseconds (μS) to about 100 μS. Other applicable time periods will be readily determined by one of ordinary skill in the art. It will be understood that the predetermined time T will vary according to a number of factors such as the update rates of the clock and data recovery system, frequency modulation rates of a received signal, and the like.

The process proceeds from the decision block 1304 to a state 1306, where the process resets the value of the accumulator. For example, the process can reset the register D of an accumulator to zero. Of course, non-zero values can also be used in the resetting process. The process then returns to the decision block 1304 to wait for another predetermined time T to see whether the accumulator should again be reset.

Returning now to the decision block 1304, if it has been determined that the system has achieved lock with a received signal, the process ends. The process can be repeated as desired.

The following illustrates the usefulness of the process in the context of applicability to both SATA and SAS interface standards. When the received data is spread spectrum modulated, such as can be the case with a SATA signal as illustrated by the waveform 1204 for the SATA interface standard of FIG. 12, the clock and data recovery system will typically achieve lock within one spread spectrum modulation cycle regardless of the initial value of the accumulator provided that the accumulator limits, e.g., A and D, are within the tracking range of the phase tracking loop. However, when the received data is not spread spectrum modulated, such as with SAS data as illustrated by the waveform for the SAS interface standard 1202, the clock and data recovery system will typically fail to achieve lock if the accumulator value has drifted, e.g., to limit D, such that the resulting frequency offset is beyond the clock and data recovery system lock range. Resetting the accumulator to a predetermined value, e.g., 0 ppm, can permit the clock and data recovery system to achieve lock.

Selection Among Two or More Frequency Sub-Ranges

Figure 14:
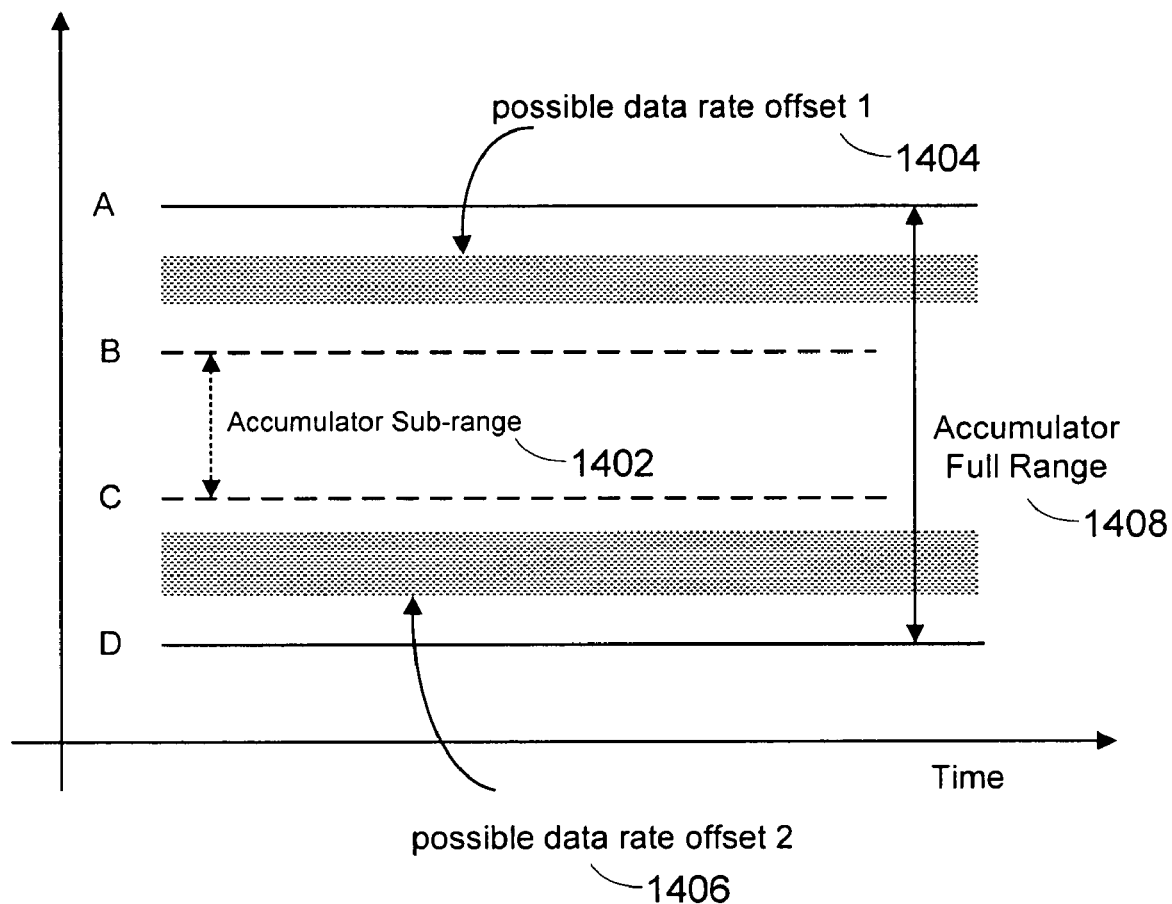
FIG. 14 illustrates using two or more accumulator sub-ranges for various frequency offsets.
Figure 15:
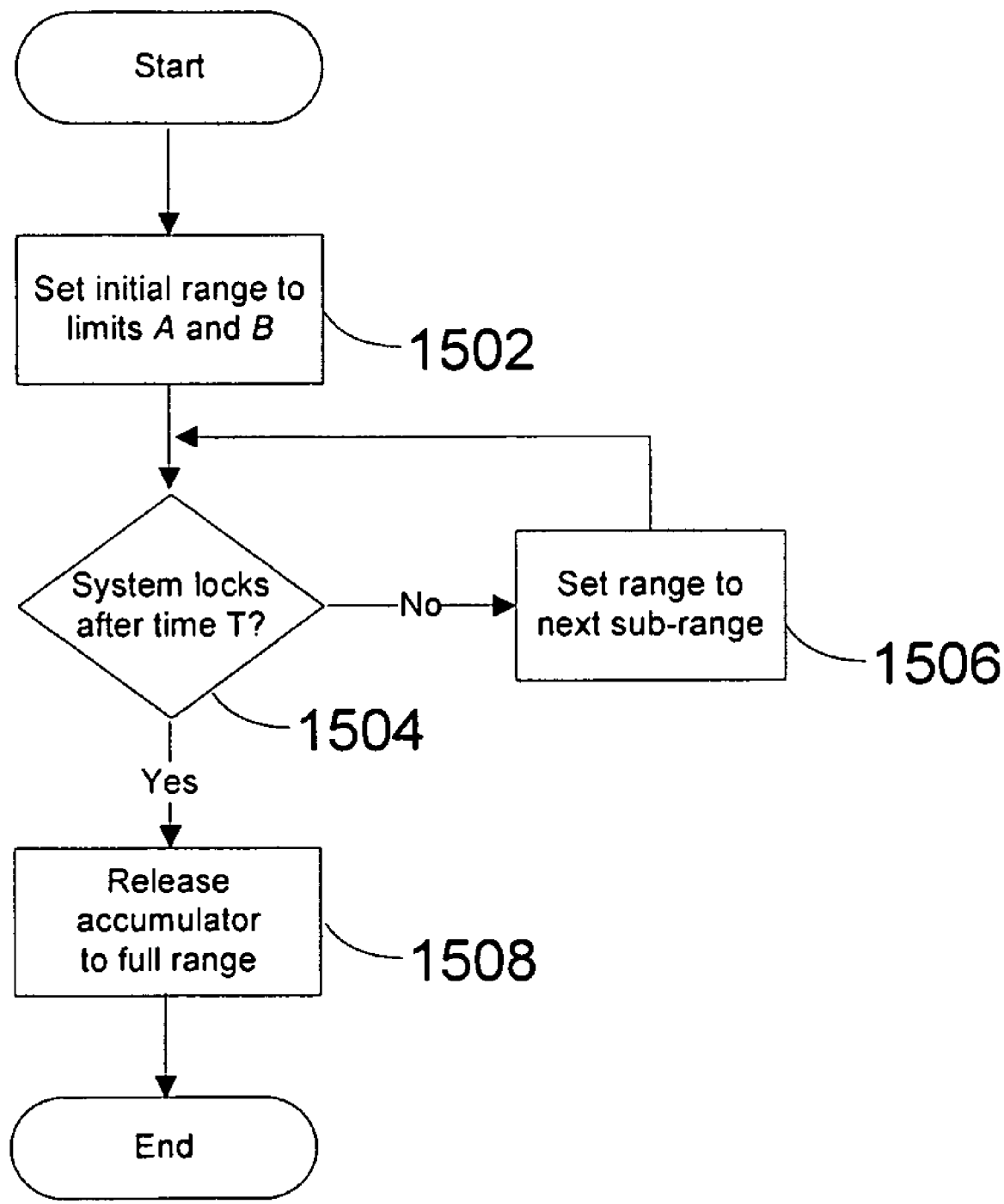
FIG. 15 is a flowchart illustrating an accumulator range selection control process.

FIGS. 14 and 15 illustrate a technique using selection among two or more frequency sub-ranges to achieve system lock. FIG. 14 is a chart illustrating using two or more accumulator sub-ranges corresponding to various frequency offsets.

When a clock and data recovery system is intended to cover a variety of applications or standards, the received data frequency offsets can lie within any of multiple accumulator sub-ranges as illustrated in FIG. 14. For example, where the applicable frequency range is very broad, an automatic frequency range control can advantageously be used to improve the likelihood that the clock and data recovery system will achieve lock to a particular incoming received signal. The applicable sub-range to use is typically not known a priori.

A horizontal axis indicates time. A vertical axis indicates frequency offset. For example, if an accumulator sub-range 1402 is selected to be within limits B and C, the accumulator can experience difficulty locking to a received signal with a data rate offset 1404 within limits A and B or to a received signal with a data rate offset 1406 within limits C and D. It would be advantageous to test other sub-ranges for possible applicability in the event that the received signal, if one is present, is present in another sub-range. After lock has been achieved, the range of the accumulator can be released to a broader range, such as to the full range 1408 of the accumulator. For example, the frequency range control process illustrated in FIG. 15 can be a feature of the pattern analyzer/lock detector 1118. In addition, while illustrated with non-overlapping sub-ranges, overlapping sub-ranges can also be used.

FIG. 15 is a flowchart illustrating an accumulator range selection control process. The illustrated process can be modified in a variety of ways. For example, in another embodiment, various portions of the illustrated process can be combined, can be rearranged in an alternate sequence, can be removed, and the like.

The process begins in a state 1502, where the process selects a sub-range for initial use. In the illustrated embodiment, sub-range AB is used. However, it will be understood that any of the sub-ranges can be used. The process advances from the state 1502 to the decision block 1504.

In the decision block 1504, the process determines whether the clock and data recovery system has achieved lock within an interval T. An applicable interval T can vary within a wide range. For example, the interval T can vary depending on the locking speed of the clock and data recovery system, the frequency of modulation of a spread spectrum modulated received signal, and the like. In one embodiment, the interval T is selected to be at least as long as the worst-case locking time anticipated, such as a time of 40 microseconds (μS).

When the time interval T has elapsed and the system has not locked to a received signal, the process proceeds from the decision block 1504 to a state 1506, which selects another sub-range, such as a BC subrange, or a CD subrange, or the like. It will be understood that when the sub-range is changed, then eventually, a previously used sub-range can also be re-selected, such as the initial AB subrange. The process returns from the state 1506 to the decision block 1504 to determine if the newly-selected sub-range permits the clock and data recovery system to achieve lock.

Returning now to the decision block 1504, when the process determines that lock has been achieved, the process proceeds from the decision block 1504 to the state 1508. In the state 1508, the process broadens the limits on the accumulator, such as, for example, releasing the limits of the accumulator to the full range of the accumulator. The process can be repeated as desired. For example, the process can be initiated when the absence of lock has been detected, upon powering up, and the like.

Resetting of the Accumulator in Response to Accumulator Drift

Figure 16:
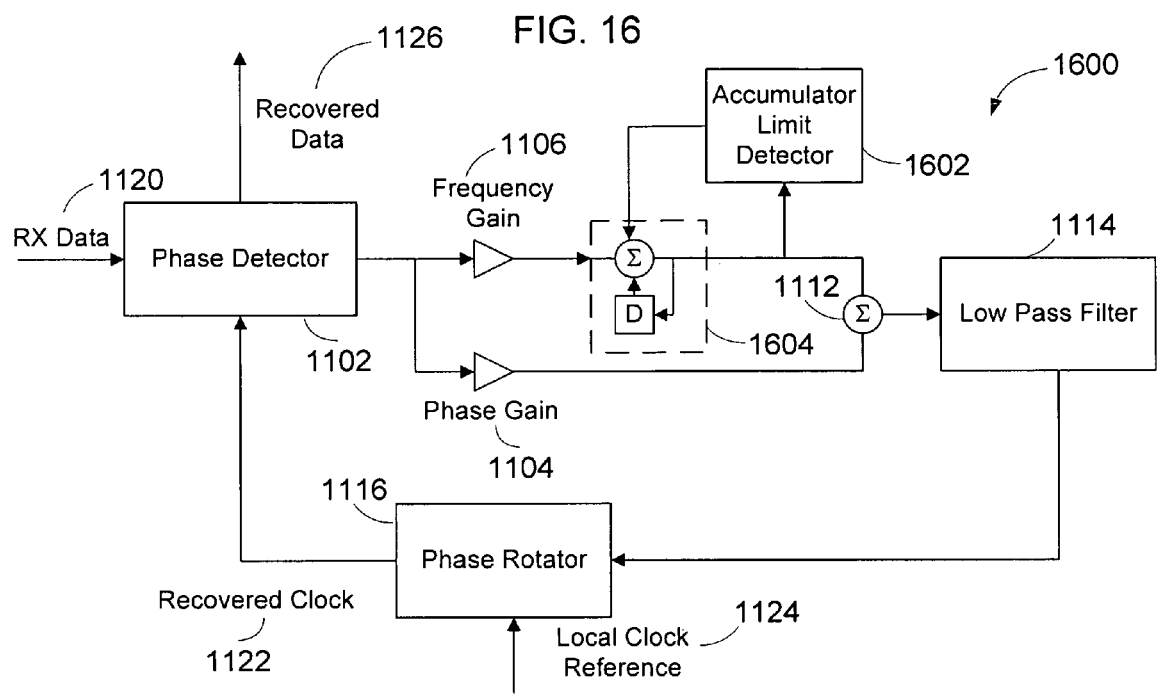
FIG. 16 illustrates an embodiment according to the invention of a clock and data recovery system with a range limit detector.

FIG. 16 illustrates an embodiment according to the invention of a clock and data recovery system 1600 with a range limit detector 1602 for the accumulator 1604. The range limit detector 1602 advantageously uses an indirect indication of whether locking has been achieved. For example, this technique can be used to determine whether locking has been achieved even when there is no recognizable pattern encoded in the data or when there is a pattern encoded in the data, but the pattern is not recognized by the clock and data recovery system. While illustrated in an embodiment without a data pattern analyzer/lock detector, the illustrated techniques can also be used with embodiments such as those with the data pattern analyzer/lock detector 1118 described earlier in connection with FIG. 11.

Figure 17:
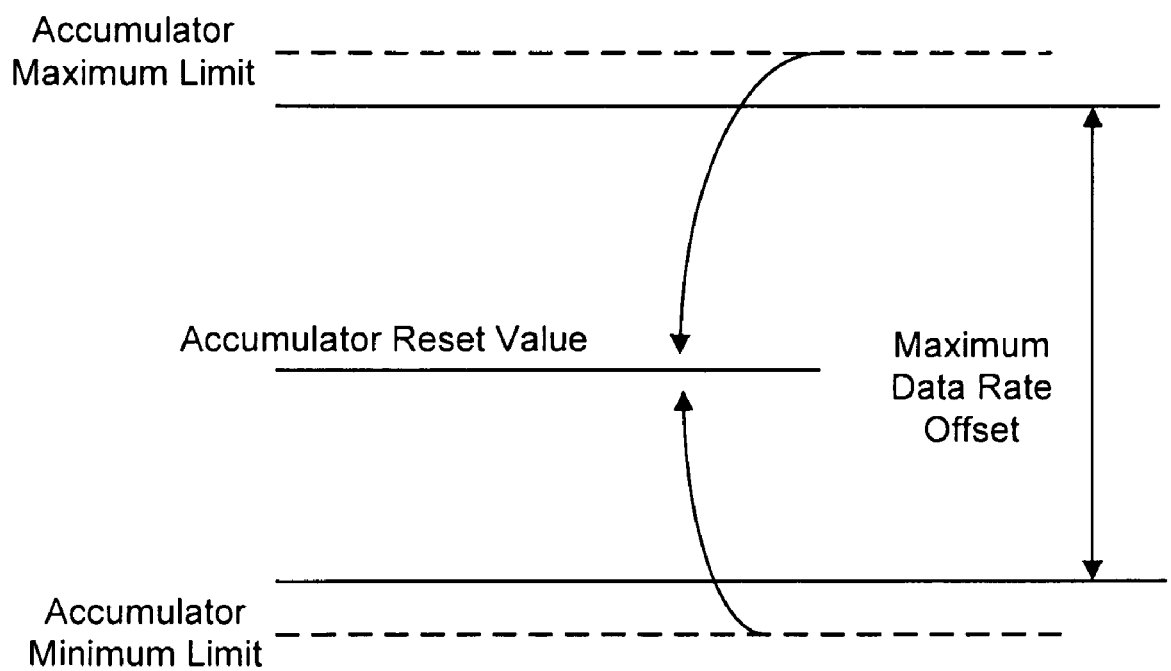
FIG. 17 illustrates resetting an accumulator value based at least partially on a detection of an accumulator limit.

FIG. 17 illustrates resetting an accumulator value based at least partially on a detection of an accumulator limit. When the value stored in the accumulator 1604 drifts to the limits for the accumulator 1604, it can be inferred that the clock and data recovery system 1600 is not locked to the received data signal RX Data 1120. By resetting the accumulator 1604 to an initial condition, the likelihood of achieving lock is improved, as the resetting of the accumulator 1604 can bring the operation of the clock and data recovery system 1600 within the locking range of the phase tracking loop. In one embodiment, the accumulator limits which trigger the resetting of the accumulator 1604 are beyond the anticipated data rate offset range for the received data signal RX Data 1120. For example, the range for the accumulator 1604 can be limited to slightly larger than the maximum frequency offset as shown in FIG. 17. When the clock and data recovery system fails to achieve lock, the accumulator value typically drifts to either the maximum or the minimum limit, and the accumulator 1604 is then reset upon detection of reaching these limit values.

The reset value of the accumulator 1602 can vary in a very wide range. Typically, if known, a value at which the clock and data recovery system can lock to all the anticipated received data frequency ranges will be used.

Achieving Lock by Dynamic Adjustment of a Gain of a Frequency Tracking Path

Figure 18:
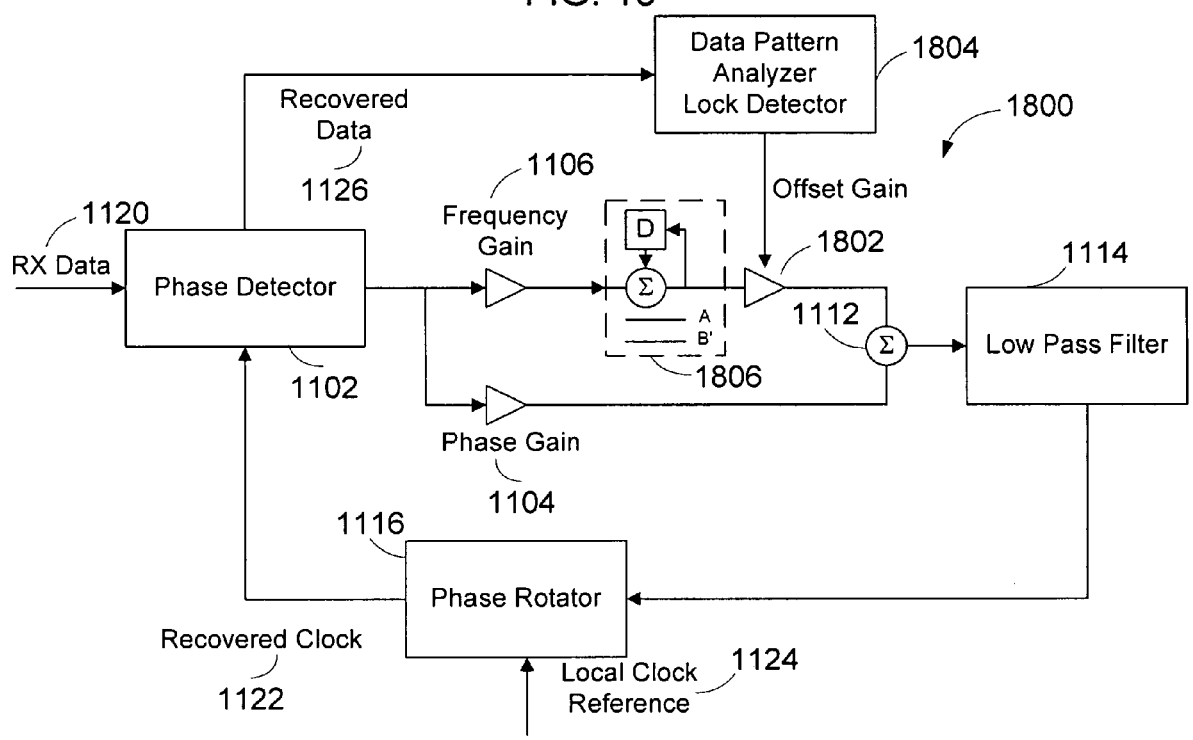
FIG. 18 illustrates an embodiment according to the invention of a clock and data recovery system with an adjustable gain in a frequency tracking path.

FIG. 18 illustrates an embodiment according to the invention of a clock and data recovery system 1800 with an adjustable gain stage 1802 in a frequency tracking path. Changing the gain of the frequency tracking path is an alternative way to change the frequency range of the clock and data recovery system 1800.

An accumulator 1806 has a range of A to B', which in this example, is selected to be wide enough to cover the anticipated frequency offset range. Operation of the clock and data recovery system 1800 will now be described without being limited to the following illustrative parameters. For example, the illustrated offset gain stage 1802 can have a maximum gain of one and a minimum gain of 1/M. When the clock and data recovery system is started or is otherwise not locked, the offset gain is set to the minimum gain of 1/M, which corresponds to an offset coverage of A/M to B'/M. While the offset minimum gain 1/M can vary in a wide range and can be application dependent, the minimum offset coverage A/M to B'/M should be selected so that the input data rate offset will be at least transiently within the A/M to B'/M range for a period of time sufficient for lock to be acquired. After the data pattern analyzer/lock detector 1804 detects a data pattern and/or other lock condition, the gain of the offset gain stage 1802 can be increased dynamically so that the clock and data recovery system offset range can track the entire range of the data rate offset.

Figure 19:
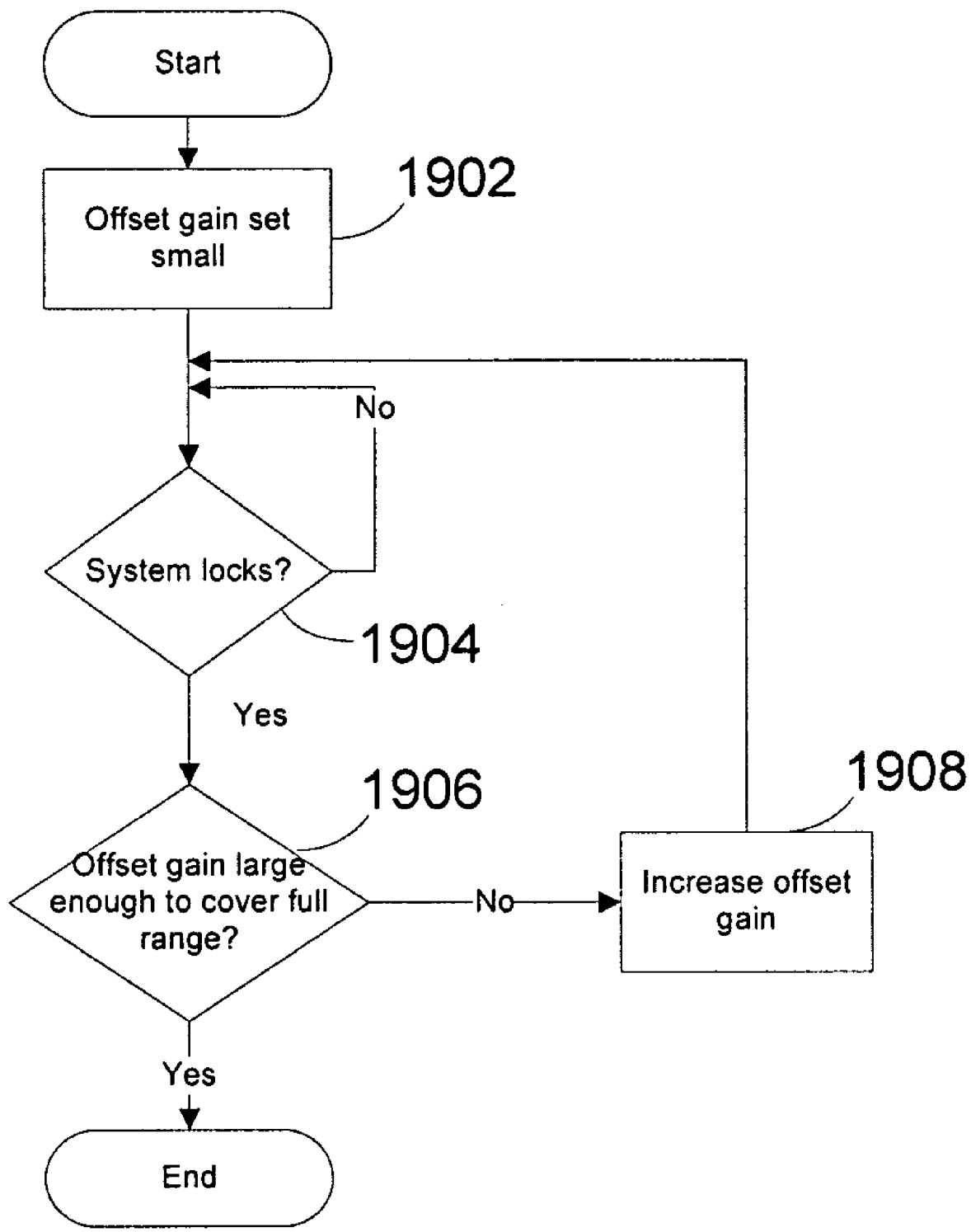
FIG. 19 is a flowchart illustrating a process for adjusting a gain associated with a frequency path to achieve lock.

FIG. 19 is a flowchart illustrating a process for adjusting a gain associated with a frequency path to achieve lock. The illustrated process can be modified in a variety of ways. For example, in another embodiment, various portions of the illustrated process can be combined, can be rearranged in an alternate sequence, can be removed, and the like. The process starts at a state 1902, where the process sets the offset gain to be relatively small, such as a minimum value. For example, a gain value of ¼ can be used. In one embodiment, the initial offset gain corresponds to a subrange that covers or partially covers the frequency offset range intended for the clock and data recovery system. The process advances from the state 1902 to a decision block 1904.

In the decision block 1904, the process determines whether the system has achieved lock. This can be determined by, for example, use of a data pattern analyzer/lock detector. If the process has achieved lock and remains in lock, the process proceeds to a decision block 1906. Otherwise, the process returns to the decision block 1904. This permits the gain to be gradually adjusted.

In the decision block 1906, the process determines whether the gain of the adjustable gain stage 1802 corresponds to the full gain or to a reduced gain. If the gain has reached the full gain, the adjustment process for the gain ends. If the gain is less than the full gain, the process proceeds to a state 1908, where the process increases the offset gain. An adjustment to the offset gain typically results in a discontinuity in frequency of the recovered clock signal 1122. In one embodiment, the offset gain is increased in gradual increments rather than all at once. With a relatively small adjustment to the offset gain, the clock and data recovery system can temporarily lose lock, but lock should be reacquired relatively quickly because the recovered clock signal should still be within the locking range of the phase tracking loop for a relatively small increment.

The process repeats until the frequency tracking path offset gain achieves a full-range or enough range to cover the data rate offset encountered. If no locking is detected, then the process of FIG. 19 can be combined with another process, such as the process described earlier in connection with FIG. 13, which can reset a center frequency for the accumulator, and then the process of FIG. 19 can be re-executed. The reset of the center frequency can be to the same center frequency previously used, or to another center frequency, which effectively changes the applicable frequency subrange.

To illustrate using the example system requirements of compliance with SATA and SAS interface standards, the A/M to B'/M sub-range should cover SAS frequency offsets; the A/M to B'/M sub-range should cover, or partially cover, the SATA frequency offsets, and assuming that the lock range of the clock and data recover system 1100 is the same or better than the lock range expressed in Equation 10, the total offset (1400 ppm) of the A/M to B'/M sub-range should be less than the lock range of the clock and data recovery system 1800. In this example, the same lock range computed earlier in connection with Equation 10 will again be used. The SATA interface standard specifies that a compliant clock and data recovery system is able to track a range of frequencies from +700 ppm to −5700 ppm (±350 ppm for transmit/receive reference clocks and −5000 ppm for spread-spectrum down spreading). However, the SAS standard specifies a compliant clock and data recovery system to recover data having a ±200 ppm offset range (±100 ppm for transmit/receive reference clocks). For example, the accumulator limit value A can be selected to cover a +700 ppm offset, and limit B' can be selected to cover a −5700 ppm offset. It will be understood that the limits used for the accumulator can be somewhat less than the limits specified for the clock and data recovery system due to the additional frequency offset that can be tracked by the phase tracking loop. A relatively small offset gain, e.g., ¼ can be selected as an initial setting for the adjustable gain stage 1802, which then permits coverage of +175 ppm to −1425 ppm frequency offset in the frequency tracking loop for this example.

The foregoing example advantageously fulfills the following example specification. The +175 ppm to −1425 ppm offset range sufficiently covers the SAS frequency offsets, which has a worst case SAS frequency offset of 200 ppm. The phase tracking loop can track the extra 25 ppm without substantially degrading jitter tolerance, which would be degraded only temporary until the gain was again readjusted higher. The +175 ppm to −1425 ppm offset range covers, or partially covers SATA frequency offsets, which permits locking to be achieved at least momentarily. The total offset 1600 ppm is less than the clock and data recovery system lock range of 1953 ppm in the described example (from Equation 10).

Due to the popularity of spread spectrum clocking schemes, more and more clock and data recovery systems should be compatible with standards that permit a data rate to be spread spectrum modulated. Such systems desirably include a frequency tracking circuit in the clock recovery system that is relatively immune to problems with initial conditions.

In the personal computer and enterprise storage industries, different protocols co-exist, such as is the case for SAS and SATA. Different chip vendors may use different protocols with or without applying spread spectrum clocking. Embodiments according to the teachings of the multi-step clock and data recovery system described herein have great benefits to the objectives of providing compatibility to a broad range of protocols with relatively good system locking characteristics.

The multi-step locking technique can be used with, but is not limited to, the dual loop clock and data recovery system. It is both power-efficient and chip-area efficient for multi-channel devices, since, for example, it can be configured to use one clock synthesis circuit that generates a local clock reference signal that is shared by all the channels on chip. The multi-step locking technique adds relatively little design overhead to the clock and data recovery system.

The multi-step locking technique is applicable not only to clock and data recovery systems in the personal computer and enterprise storage industries, but also to clock and data recovery systems in other industries, such as telecommunication, data communication, and wireless communication. Due to the compliance requirements of controlling electromagnetic emissions, utilization of spread spectrum clocking technology is likely to continue to be exploited in the future.

Various embodiments of the invention have been described above. Although described with reference to these specific embodiments, the descriptions are intended to be illustrative of the invention and are not intended to be limiting. Various modifications and applications may occur to those familiar with the subject without departing from the true spirit and scope of the invention as defined in the appended claims.

What is claimed is:

1. An apparatus for recovering a clock signal, the apparatus comprising:
   a phase detector configured to receive an input data signal and to receive a recovered clock signal, the phase detector further configured to generate a signal with an indication of a phase difference between the input data signal and the recovered clock signal; and
   a feedback circuit operatively coupled to the phase detector, the feedback circuit configured to receive the generated signal from the phase detector and to receive a reference signal, the feedback circuit configured to generate the recovered clock signal, wherein the feedback circuit takes into consideration whether the recovered clock signal is at least momentarily phase locked to the input data signal in selecting a frequency range, wherein the feedback circuit further comprises:
   a phase tracking path; and
   a frequency tracking path with an accumulator, the accumulator having at least one range limit that is dynamically selectable for dynamic selection of the limit of the frequency range of the feedback circuit, wherein the accumulator for the frequency tracking path is configured to have at least a first predetermined value range for a full range, a second predetermined value range for a first subrange, and a third predetermined value range for a second subrange, the second predetermined value range having a range different than the third predetermined value range, the second predetermined value range and the third predetermined value range having ranges smaller than the first predetermined value range, wherein the accumulator is initially configured to select the second predetermined value range, wherein the accumulator is configured to select the third predetermined value range after a predetermined time has elapsed after which phase lock has been determined to have not occurred, wherein the accumulator is further configured to select the first predetermined value range after phase lock has occurred.

2. An apparatus for recovering a clock signal, the apparatus comprising:
   a phase detector configured to receive an input data signal and to receive a recovered clock signal, the phase detector further configured to generate a signal with an indication of a phase difference between the input data signal and the recovered clock signal; and
   a feedback circuit operatively coupled to the phase detector, the feedback circuit configured to receive the generated signal from the phase detector and to receive a reference signal, the feedback circuit configured to generate the recovered clock signal, wherein the feedback circuit takes into consideration whether the recovered clock signal is at least momentarily phase locked to the input data signal in selecting a frequency range, wherein the feedback circuit further comprises:
   a phase tracking path; and
   a frequency tracking path having an adjustable frequency tracking path gain, wherein the frequency tracking path has a first frequency tracking path gain when phase lock has not been determined and has a second frequency tracking path gain higher than the first frequency tracking path gain when phase lock has been determined, wherein the frequency tracking path is further configured to increase the frequency tracking path gain from the first frequency tracking path gain to the second frequency tracking path gain in an incremental manner such that the recovered clock signal remains within the locking range of the feedback circuit.

3. The apparatus as defined in claim 2, wherein the apparatus is incorporated into a storage system.

4. A method for recovering a clock signal, the method comprising:
   receiving an input data signal;

receiving a reference signal;
generating an adjustment for a recovered clock signal based at least partly on a comparison between the input data signal and a recovered clock signal;
limiting a frequency range for the adjustment to a first frequency range when the input data signal and the recovered clock signal are not locked;
limiting a frequency range for the adjustment to a second frequency range other than the first frequency range when the input data signal and the recovered clock signal are locked; and
generating the recovered clock signal based at least partly on the reference signal and the adjustment;
wherein limiting the frequency range for the adjustment to the first frequency range further comprises:
  selecting one from a plurality of limited frequency ranges for the adjustment when the input data signal and the recovered clock signal are not locked, wherein each of the limited frequency ranges of the plurality has a frequency range that is smaller than the second frequency range, the plurality including the first frequency range;
  determining whether the input data signal and the recovered clock signal have locked within a predetermined time interval for a particular frequency range from the plurality; and
  selecting a different one from the plurality of limited frequency ranges at least partially in response to a determination that the predetermined time interval has elapsed without detection of phase lock;
wherein receiving the input data signal, receiving the reference signal, generating the adjustment, limiting the frequency range for the adjustment to the first frequency range, limiting the frequency range for the adjustment to the second frequency range, and generating the recovered clock signal are performed by electronic hardware.

5. The method as defined in claim 4, wherein locked is phase locked.

6. The method as defined in claim 4, wherein the second frequency range is larger than the first frequency range.

7. A method for recovering a clock signal, the method comprising:
  receiving an input data signal;
  receiving a reference signal;
  generating an adjustment for a recovered clock signal based at least partly on a comparison between the input data signal and a recovered clock signal;
  limiting a frequency range for the adjustment to a first frequency range when the input data signal and the recovered clock signal are not locked;
  limiting a frequency range for the adjustment to a second frequency range other than the first frequency range when the input data signal and the recovered clock signal are locked;
  generating the recovered clock signal based at least partly on the reference signal and the adjustment;
  changing the limits for the frequency range for the adjustment by adjusting a frequency tracking path gain; and
  adjusting the frequency tracking path gain from a gain corresponding to the first frequency range to a gain corresponding to the second frequency range in an incremental manner such that the recovered clock signal remains within a locking range of an associated phase tracking path;
  wherein receiving the input data signal, receiving the reference signal, generating the adjustment, limiting the frequency range for the adjustment to the first frequency range, limiting the frequency range for the adjustment to the second frequency range, and generating the recovered clock signal are performed by electronic hardware.

8. The method as defined in claim 7, wherein the second frequency range is larger than the first frequency range.

9. The method as defined in claim 7, wherein locked is phase locked.

* * * * *